March 1, 1966

K. H. GEYER 3,238,425

ENCAPSULED SEMICONDUCTOR DEVICE
AND METHOD OF ITS MANUFACTURE

Filed Sept. 28, 1961

United States Patent Office 3,238,425

Patented Mar. 1, 1966

3,238,425

ENCAPSULED SEMICONDUCTOR DEVICE AND METHOD OF ITS MANUFACTURE

Karl Heinz Geyer, Munich, Germany, assignor to Siemens-Schuckertwerke Aktiengesellschaft, Berlin-Siemensstadt, Germany, a corporation of Germany

Filed Sept. 28, 1961, Ser. No. 141,508
Claims priority, application Germany, Sept. 30, 1960, S 7,040
10 Claims. (Cl. 317—234)

My invention relates to encapsuled electronic p-n junction rectifiers, transistors, controlled rectifiers or other electronic switches and similar devices and has for its main object to devise an encapsuled semiconductor unit that can be produced in a relatively simple manner while affording an improved mechanical strength and hermetic seal resulting generally in a correspondingly prolonged time of useful life.

Another subsidiary object of my invention is to provide a design and method of encapsulation that are equally well applicable to various types of semiconductor devices for example junction type rectifiers produced by an alloying process, or produced by a diffusion process, or by methods according to which semiconductor layers of different electric conductance type or different degree of doping are precipitated upon a monocrystalline carrier of semiconductor material by thermal dissociation of a gaseous compound of the same semiconductor material and of the doping substance or doping substances.

According to a feature of my invention, the semiconductor member, such as a disc of silicon which comprises a p-n junction, whose opposite electrode surfaces are provided with rigid and massive connector electrodes of sufficient thickness for dissipating the electric heat losses occurring in the semiconductor device, is arranged in the hollow space of an electrically insulating frame structure, such as a ring-shaped disc, and the above-mentioned connector electrodes of the semiconductor member are mechanically connected through respective metal wall structures with the ring or frame structure at mutually insulated localities, the frame structure and the metal wall forming jointly a hermetic housing in which the semiconductor member with its electrodes is encapsuled.

The semiconductor member, inclusive of its connector electrodes, can be made and completed in accordance with any one of the above-mentioned known methods before being assembled with the frame structure and the metal structures that constitute the housing or capsule of the finished device. However, according to another feature of my invention, the manufacture of the entire semiconductor device is performed with the aid of a minimized amount of equipment and within shorter time by performing a single heat-treating process for joining the electrodes with the semiconductor body, alloying the electrodes together with the body, doping the body in order to produce therein the desired zones of a predetermined electric conductance type, and for also gas-tightly sealing the semiconductor member within its capsule.

According to still another feature of my invention, at least one of the above-mentioned metallic wall structures that mechanically connect one of the electrodes of the encapsuled semiconductor member with the insulating frame or ring structure is given a yielding design so that it essentially constitutes an elastic diaphragm. This has the result that any mechanical forming forces resulting from temperature-responsive elongation of components do not cause any damage to the encapsuled device.

According to a further feature of the invention, one or both of the above-mentioned metallic connecting structures between an electrode of the semiconductor member and the surrounding insulating frame structure is given such a design that it also constitutes an auxiliary jig or positional stop or guide for securing the proper correlation or positioning of the insulating frame or ring relative to the enclosed semiconductor member with its connector electrodes. For this purpose, such a connecting structure can be provided, for example, with a corresponding recess or cavity into which the semiconductor member and one of its connector electrodes can be seated. This connecting electrode body may consist, for example, of tungsten, tantalum or molybdenum, these being materials whose thermal coefficient of expansion is close to that of the semiconductor material. This prevents the occurrence of undesired mechanical tension by thermal effects acting upon the electrical connecting parts of the device during operation of the semiconductor unit as well as during manufacture of the device.

The frame or ring-shaped insulating structure in whose hollow space the semiconductor member is located may consist of a uniform insulating material, for example ceramic material. However, the frame structure may also be composed of two metal bodies between which a body of insulating material is located.

The above-mentioned and more specific features of the invention will be apparent from, and will be explained in, the following with reference to the electronic semiconductor devices according to the invention illustrated by way of example in the accompanying drawings, in which.

Figure 1:
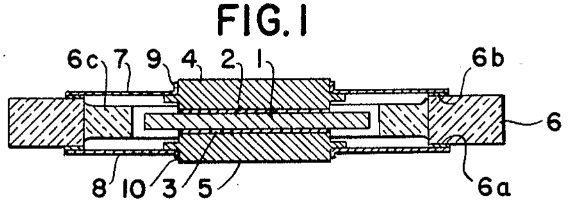
FIG. 1 is a diametrical section of a first embodiment of the semiconductor device of the present invention.

The device shown in FIG. 1 comprises a circular semiconductor disc 1 of weakly p-conducting silicon with which two electrode bodies 2 and 3 are joined by alloying on the two respective faces of the disc. The electrode 2, forming essentially a thin coating, consists for example of an antimony-containing gold foil (for example with about 1% Sb, the remainder gold) but may also consist of silver with a slight content of antimony. The electrode coating 3 on the opposite side of the silicon disc 1 consisting of aluminum, boron-containing gold foil (for example with about 1% boron), or boron-containing silver, depending upon the particular type of semiconductor device. The electrode coatings or foil electrodes 2, 3 are joined face-to-face by soldering or alloying with respective circular electrode bodies 4 and 5. These consist of a metal whose thermal coefficient of expansion is close to that of the semiconductor material. In the present case, both electrodes 4 and 5 preferably consist of molybdenum or tungsten. They constitute relatively massive bodies to serve as connector electrodes or terminals of the semiconductor member and also transmit waste heat from the semiconductor disc 1 to the mounting structure or heat sink to which the semiconductor device is attached when in operation. Each of the connector electrodes 4 and 5 has a thickness which is greater than the thickness of the semiconductor disc 1 along the axis of the semiconductor device.

The device according to FIG. 1 further comprises a ring-shaped frame 6 of insulating material which is metallized at the annular locations *6a* and *6b* prior to being mounted together with the other components. Two diaphragm structures 7 and 8 of metal are peripherally joined at *6a* and *6b* by hard soldering with the insulating ring 6. Each of the diaphragm rings 7, 8 is provided with a central opening bordered by an outwardly directed flange portion 9 or 10 that engages the periphery of the connector electrode 4 or 5. The diaphragm structures 7 and 8 rest against respective peripheral shoulders of the respective connector electrodes 4 and 5 and are soldered together with the corresponding electrodes.

The insulating frame structure 6 may, for example, consist of a ceramic material, metallized at those places where the frame structure is to be subsequently engaged by the metallic structures that connect it with the connector electrodes of the semiconductor member. The mechanical junction between the metal structures and the insulating frame structure or ring can then be made by soldering with soft solder or hard solder.

Joined with the insulating ring 6 along the inner periphery of the latter is another ring 6*c* of insulating material whose inner diameter is only slightly larger than the outer diameter of the silicon disc 1. The inner ring 6*c* thus forms a guiding body which facilitates properly positioning the semiconductor member into the frame structure when the components of the device are being assembled. The above-mentioned soldering operations are preferably performed in vacuum or in a protective gas atmosphere, and the space then becoming enclosed and sealed within the components of the housing or capsule can subsequently or simultaneously be filled with protective gas.

Also suitable for design of the insulating ring is a pressure-glass fusion junction consisting of a glass body between two concentric metal pressure rings. The rings have such dimensions that during production of the pressure-glass fusion junction, the enclosed mass of glass is subjected to pressures. These cause during cooling, forces which impose such pressure upon the glass that the glass body, when thereafter subjected to thermal stresses at the temperatures occurring during operation, can never be subjected to tensioning (pulling) forces which would result in cracking of the glass. The embodiment of FIG. 2 incorporates this feature.

Figure 2:
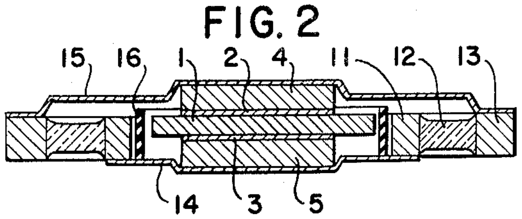
FIG. 2 is a diametrical sectional view of a second embodiment, of the semiconductor device of the present invention.

In the embodiment illustrated in FIG. 2, the semiconductor member proper, inclusive of its electrodes, has the same design as described above with reference to FIG. 1, corresponding components being denoted by the same respective reference characters in both illustrations. However, in the device according to FIG. 2, the insulating ring of the housing structure is constituted by a pressure-glass fusion structure whose annular glass body is denoted by 12 and is fused together with an inner pressure ring 11 of metal and an outer pressure ring 13 also consisting of metal. The diaphragm-light metal structures 14 and 15 which complete the housing form an electric connection between each of the two electrodes 4, 5 of the encapsuled semiconductor member in one of the respective metal rings 11, 13 of the frame structure. Each of the diaphragm structures 14, 15 is joined with the pressure ring 11 or 12 by electric resistance welding. Located in the hollow space of the inner pressure ring 11 is an additional cylindrical body 16 of the insulating material which prevents an electric contact between the semiconductor disc 1 and the inner ring 11 of the frame structure. The two diaphragm-like wall structures 14 and 15 have a cavity in their middle portion in which one of the connector electrodes 4, 5 of the semiconductor member is located and properly positioned. The electric contact between parts 4 and 15 and also the corresponding contact between parts 5 and 14 can be effected merely by their pressure engagement with each other over the relatively large engaging areas. However, the two adjacent parts can also be additionally soldered or welded to each other. It is preferable to employ for this purpose an electric resistance welding process by placing the welding electrodes beside each other upon one of the two diaphragm structures 14 or 15 at a time, for example so that the welding current passes from one welding electrode through part of diaphragm 15, the connector electrode 4, another part of diaphragm 15 and then to the second welding electrode.

The provision of an insulating frame or ring structure 6 in form of a pressure-glass fusion structure, as described above, has the advantage that it permits the mechanical connection between each of the concentric metal rings 11, 13 of the pressure-glass fusion structure and the respective mechanical connecting walls 14, 15 to be effected by electric welding, particularly electric resistance welding. The resistance welding is preferably performed by providing one of the two bodies to be welded together, with an endless bulge or ridge extending around the frame opening and having a tapering ridge cross-section for example of triangular or trapezoidal shape as shown. Then, the first mutual contact of the bodies to be welded together takes place at small areas of relatively high electrical resistance so that in this manner the welding process is initiated in a reliably successful manner before it is continued up to completion of the welded junction.

As mentioned above, a semiconductor device of the type described with reference to FIGS. 1, 2 can be produced by first completing the semiconductor element inclusive of its connector electrodes that are to be alloyed together or otherwise bonded to the semiconductor body proper. The semiconductor element thus completed can then be inserted into a frame and housing structure composed, for example according to FIG. 1, of the components 6, 7 and 8, whereafter the hard-solder junction between components 7 and 4 and at the metallized location 6*a*, 6*b* of ring 6 is produced.

However, another way of producing the device according to the invention is to simply assemble the parts of the semiconductor member with the components of the frame and housing structure and to then perform and complete the production of the entire device by a single heating process. This can be done, for example, as follows. Referring to FIG. 1, the individual components 1 to 5 of the semiconductor member are first stacked in the proper order upon the diaphragm structure 8. Thereafter the framing ring 6 and the metallic diaphragm structure 7 are added. Now, the entire assembly is subjected to heating with the result that the semiconductor member is subjected to alloying and a hard-solder junction is formed between parts 4 and 7, 5 and 8, 7 and 6, 8 and 6. This processing, when performed with components as described above with reference to FIG. 1, has the effect that the silicon disc 1 becomes doped from the antimony and/or boron of its foil electrodes 2, 3 and becomes also alloyed together and thus securely bonded to these foil electrodes as well as to the connector electrodes 4 and 5.

The manufacturing process can be modified, for example, by first joining the insulating ring 6 with the diaphragm body 8. This is of advantage because when the components are stacked upon the diaphragm structure 8, the insulating ring 6*c* acts as a guide for properly positioning the semiconductor disc 1.

Figure 3:
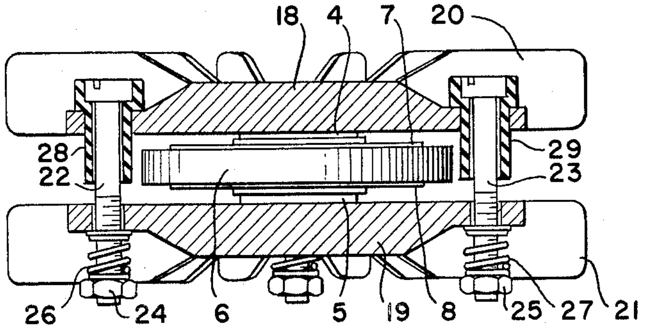
FIG. 3 is a partly sectional view of a device corresponding to FIG. 1 or 2 and completed by the provision of cooling components.

A semiconductor device designed and completed as described above with reference to FIGS. 1 and 2, can be joined with a cooling or heat-sink structure or may be clamped into such a structure so that the latter constitutes an effective heat sink for dissipating the heat losses that occur in the semiconductor device during operation. Such an assembly is illustrated by the embodiment according to FIG. 3. The cooling device comprises two metal bodies 18 and 19, each provided with cooling vanes 20, 21. The two cooling bodies 18 and 19 are pressed together by means of screw bolts 22 and 23, each provided with a tightening nut 24, 25 and preferably also with a helical compression spring 26, 27 located between the nut and the body 19. To provide for an electrically insulating separation between the two cooling bodies 18 and 19, of which each is in electric contact with one of the two mutually insulated diaphragms 7, 8 or 14, 15, the bolts 22 and 23 shown are provided with insulating sleeves 28, 29 at those locations where they pass through bores of the body 18.

As noted, the encapsuled semiconductor device according to the invention provides within the ring-shaped frame structure an additional auxiliary body 6c, 16 which serves as a jig or gauge, or also as a positioning guide or stop for the proper insertion of the semiconductor member into the frame. If, for example, the frame structure consists of a ring consisting throughout of insulating material as in FIG. 1, the just-mentioned internal body 6c for securing a proper center position of the semiconductor member may be made of an integral piece with the insulating body of the frame 6. However, the auxiliary inner body may also be inserted into the frame as a separately produced piece. Such an inserted positioning body of insulating material is particularly preferable in devices in which the insulating frame or ring structure consists of a pressure-glass fusion structure, as in FIG. 2, because then a metal body directly encloses the semiconductor member or is directly adjacent to the outer periphery of the semiconductor member. The provision of such an auxiliary body in the hollow space of the insulating frame structure for properly positioning the semiconductor member is particularly advantageous when the semiconductor device is produced and encapsuled with the aid of a single heat-treating process, that is if, for example, the electrodes are alloyed together with the semiconductor body and are also joined with the components of the housing by the same heat treatment that also serves to complete and seal the housing. It is necessary in this case that the electrodes to be alloyed into the surface of the semiconductor body and also the connector electrodes with the electrode bodies to be alloyed, are already placed together in a given position relative to one another before the heat treatment is applied in order to cause alloying and doping of the semiconductor body with the dope-containing electrodes, the bonding of the latter with the connector electrodes, and the connection of the connector electrodes with the insulating frame structure through the metallic connecting walls of the capsule. The positioning auxiliary body then preferably engages the periphery of the semiconductor body to hold this body in the correct position. The bodies of electrode material to be alloyed into the surfaces of the semiconductor body can then be temporarily attached to the proper surface areas of the semiconductor body by a suitable adhesive, for example paraffin.

It will be obvious to those skilled in the art, upon studying this disclosure, that my invention is amenable to various modifications with respect to details and can be given embodiments other than particularly illustrated and described herein, without departing from the essential features of my invention and within the scope of the claims annexed hereto.

I claim:

1. An electronic semiconductor device comprising a semiconductor member having an axis and two rigid and massive connector electrodes joined face-to-face with said semiconductor member on opposite respective sides thereof, each of said electrodes having a coefficient of expansion corresponding to that of said semiconductor member and having a thickness which is greater than the thickness of said semiconductor member along the semiconductor member axis, an electrically insulating ring-shaped frame structure surrounding said semiconductor member and said electrodes, and two flat disc-shaped metal wall structures in abutting electrical contact with said respective electrodes and joined with said frame structure at opposite respective surfaces thereof, said wall structures and said frame structure jointly forming a sealed housing encapsuling said semiconductor member, said insulating frame structure including within its inner marginal zone a guide adapted to the periphery of the semiconductor member for maintaining the position of the semiconductor member.

2. An electronic semiconductor device comprising a semiconductor disc member having an axis and two rigid and massive connector electrodes joined face-to-face with said semiconductor member on opposite respective faces thereof, each of said electrodes having a coefficient of expansion corresponding to that of said semiconductor member and having a thickness which is greater than the thickness of said semiconductor member along the semiconductor member axis and a flat surface facing away from said semiconductor member, an electrically insulating ring-shaped frame structure coaxially surrounding said semiconductor member and said electrodes, two substantially circular flat metal wall structures in pressure contact with their centers to said electrodes and with their peripheries to said frame structure at opposite respective sides thereof, said wall structures and said frame structure jointly forming a sealed housing encapsulating said semiconductor member, said insulating frame structure including within its inner marginal zone a guide adapted to the periphery of the semiconductor member for maintaining the position of the semiconductor member, and heat radiating means having flat-surfaced cheeks engaging said flat surfaces clamping said electrodes.

3. An electronic semiconductor device comprising a semiconductor member having an axis and two rigid and massive connector electrodes joined face-to-face with said semiconductor member on opposite respective sides thereof, each of said electrodes having a coefficient of expansion corresponding to that of said semiconductor member and having a thickness which is greater than the thickness of said semiconductor member axis, an electrically insulating ring-shaped frame structure surrounding said semiconductor member and said electrodes, and two flat disc-shaped metal wall structures in abutting electrical contact with said respective electrodes and joined with said frame structure at opposite respective surfaces thereof, said wall structures and said frame structure jointly forming a sealed housing encapsuling said semiconductor member, said insulating frame structure including within its inner marginal zone a guide adapted to the periphery of the semiconductor member for maintaining the position of the semiconductor member, said guide being integral with the inner marginal zone of said frame structure.

4. An electronic semiconductor device comprising a semiconductor member having an axis and two rigid and massive connector electrodes joined face-to-face with said semiconductor member on opposite respective sides thereof, each of said electrodes having a coefficient of expansion corresponding to that of said semiconductor member and having a thickness which is greater than the thickness of said semiconductor member along the semiconductor member axis and a flat surface facing away from said semiconductor member, an electrically insulating ring-shaped frame structure surrounding said semiconductor member and said electrodes, two flat disc-shaped metal wall structures in abutting electrical contact with said respective electrodes and joined with said frame structure at opposite respective surfaces thereof, said wall structures and said frame structure jointly forming a sealed housing encapsuling said semiconductor member, said insulating frame structure including within its inner marginal zone a guide adapted to the periphery of the semiconductor member for maintaining the position of the semiconductor member, said guide being an inserted insulating member, and heat radiating means having flat-surfaced cheeks engaging said flat surfaces clamping said electrodes.

5. An electronic semiconductor device comprising a semiconductor disc member having an axis and two rigid and massive connector electrodes joined face-to-face with said semiconductor member on opposite respective faces thereof, each of said electrodes having a coefficient of expansion corresponding to that of said semiconductor member and having a thickness which is greater than the thickness of said semiconductor member along the semiconductor member axis and a flat surface facing away from said semiconductor member, an electrically insulating ring-shaped frame structure coaxially surrounding said semiconductor member and said electrodes, two substantially flat circular metal wall structures in pressure contact with their centers to said electrodes and with their peripheries to said frame structure at opposite respective sides thereof, said wall structures and said frame structure jointly forming a sealed housing encapsulating said semiconductor member, said insulating frame structure including within its inner marginal zone a guide adapted to the periphery of the semiconductor member for maintaining the position of the semiconductor member, said guide being integral with the inner marginal zone of said frame structure, and heat radiating means having flat-surfaced cheeks engaging said flat surfaces clamping said electrodes.

6. An electronic semiconductor device comprising a semiconductor disc member having an axis and two rigid and massive connector electrodes joined face-to-face with said semiconductor member on opposite respective faces thereof, each of said electrodes having a coefficient of expansion corresponding to that of said semiconductor member and having a thickness which is greater than the thickness of said semiconductor member along the semiconductor member axis, an electrically insulating ring-shaped frame structure coaxially surrounding said semiconductor member and said electrodes, and two substantially circular flat metal wall structures in abutting electrical contact with their centers to said electrodes and with their peripheries to said frame structure at opposite respective sides thereof, said wall structures and said frame structure jointly forming a sealed housing encapsulating said semiconductor member, said insulating frame structure including within its inner marginal zone a guide adapted to the periphery of the semiconductor member for maintaining the position of the semiconductor member, said guide being an inserted insulating member.

7. An electronic semiconductor device comprising a semiconductor disc member having an axis and two rigid and massive connector electrodes joined face-to-face with said semiconductor member on opposite respective faces thereof, each of said electrodes having a coefficient of expansion corresponding to that of said semiconductor member and having a thickness which is greater than the thickness of said semiconductor member along the semiconductor member axis, an electrically insulating ring-shaped frame structure coaxially surrounding said semiconductor member and said electrodes, and two substantially flat circular metal wall structures in pressure contact with their centers to said electrodes and with their peripheries to said frame structure at opposite respective sides thereof, said wall structures and said frame structure jointly forming a sealed housing encapsulating said semiconductor member, said insulating frame structure consisting of a pressure-glass fusion structure which includes two concentric metal pressure rings and a body of glass between the two metal rings, said metal wall structures of the housing being fusion-joined with the respective metal pressure rings.

8. An electronic semiconductor device comprising a semiconductor disc member having an axis and two rigid and massive connector electrodes joined face-to-face with said semiconductor member on opposite respective faces thereof and a flat surface facing away from said semiconductor member, said electrodes having a coefficient of expansion corresponding to that of said semiconductor member and having flat surfaces facing away from the semiconductor member which are a multiple of the electrode thickness along the semiconductor member axis, an electrically insulating ring-shaped frame structure coaxially surrounding said semiconductor member and said electrodes, two substantially flat circular metal wall structures in abutting electrical contact with their centers to said electrodes and with their peripheries to said frame structure at opposite respective sides thereof, said wall structures and said frame structure jointly forming a sealed housing encapsulating said semiconductor member, said insulating frame structure consisting of a pressure-glass fusion structure which includes two concentric metal pressure rings and a body of glass between the two metal rings, said metal wall structures of the housing being fusion-joined with the respective metal pressure rings, and an annular insulating body located within the inner metal pressure ring of the pressure-glass fusion structure for maintaining the proper position of the semiconductor member, and heat radiating means having flat-surfaced cheeks engaging said flat surfaces clamping said electrodes.

9. The method of forming a semiconductor device comprising sandwiching a disc-shaped semiconductor member between two disc-shaped massive electrodes, placing one electrode of said sandwich in contact with a metal sheet structure extending outwardly from said electrode, placing around said sandwich and upon said sheet structure an open ring-shaped frame structure, engaging said sandwich and said ring structure with a second sheet structure extending outwardly from the other electrode so that each sheet structure contacts a corresponding one of said electrodes and respective opposite sides of said ring structure, and heating the stacked assembly whereby the semiconductor member is subjected to alloying and a junction is formed between the respective electrodes and said semiconductor member.

10. The method of forming a semiconductor device comprising sandwiching a disc-shaped semiconductor member between two disc-shaped massive electrodes, placing one electrode of said sandwich in contact with a metal sheet structure extending outwardly from said electrode, placing around said sandwich and upon said sheet structure an open ring-shaped frame structure, engaging said sandwich and said ring structure with a second sheet structure extending outwardly from the other electrode so that each sheet structure contacts a corresponding one of said electrodes and respective opposite sides of said ring structure, and heating the stacked assembly whereby the semiconductor member is subjected to alloying and a junction is formed between the respective electrodes and said semiconductor member, and clamping two flat cheeks of a heat radiating device on opposite sides of the resultant structure so that each cheek engages a corresponding one of said electrodes.

References Cited by the Examiner

UNITED STATES PATENTS

| | | | |
|---|---|---|---|
| 2,751,528 | 6/1956 | Burton | 317—234 |
| 2,864,980 | 12/1958 | Mueller et al. | 317—234 |
| 2,876,401 | 3/1959 | Fuller | 317—235 |
| 2,921,245 | 1/1960 | Wallace et al. | 317—234 |
| 2,959,718 | 11/1960 | Kadelburg et al. | 317—234 |
| 2,965,818 | 12/1960 | Connell | 317—234 |

FOREIGN PATENTS

| | | |
|---|---|---|
| 779,195 | 7/1957 | Great Britain. |
| 805,443 | 12/1958 | Great Britain. |

JAMES D. KALLAM, *Primary Examiner.*

DAVID J. GALVIN, *Examiner.*

R. F. POLISSACK, *Assistant Examiner.*